(12) United States Patent
Ahmed et al.

(10) Patent No.: US 10,784,325 B2
(45) Date of Patent: Sep. 22, 2020

(54) SADDLE CHANNEL THIN FILM TRANSISTOR FOR DRIVING MICRO LEDS OR OLEDS IN ULTRAHIGH RESOLUTION DISPLAYS

(71) Applicant: INTEL CORPORATION, Santa Clara, CA (US)

(72) Inventors: Khaled Ahmed, Anaheim, CA (US); Prashant Majhi, San Jose, CA (US); Kunjal Parikh, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 214 days.

(21) Appl. No.: 15/390,366

(22) Filed: Dec. 23, 2016

(65) Prior Publication Data
US 2018/0182831 A1 Jun. 28, 2018

(51) Int. Cl.
H01L 27/32 (2006.01)
H01L 29/786 (2006.01)
H01L 27/12 (2006.01)

(52) U.S. Cl.
CPC ...... *H01L 27/3262* (2013.01); *H01L 27/1218* (2013.01); *H01L 27/1225* (2013.01); *H01L 27/1285* (2013.01); *H01L 29/7869* (2013.01); *H01L 29/78603* (2013.01); *H01L 29/78696* (2013.01); *H01L 27/3248* (2013.01)

(58) Field of Classification Search
CPC .......... H01L 51/0545; H01L 51/0541; H01L 21/775; H01L 27/12; H01L 31/725; H01L 31/1892; H01L 33/0079; H01L 27/14612; H01L 25/0756; H01L 33/34

USPC ........ 257/40, 59, 72, 224, 368, 401; 438/82, 438/99, 48, 128
See application file for complete search history.

(56) References Cited

U.S. PATENT DOCUMENTS 8,163,581 B1 * 4/2012 Or-Bach ............. H01L 31/0725 438/39
8,298,875 B1 * 10/2012 Or-Bach ............. H01L 29/4236 257/E21.411
9,082,735 B1 * 7/2015 Sundararajan ...... H01L 51/5209
9,472,734 B1 * 10/2016 Chen et al. .......... H01L 33/505 257/98
9,806,075 B2 * 10/2017 Song ................ H01L 21/82343

(Continued)

OTHER PUBLICATIONS

Yeom et al., "Oxide Vertical TFTs for the Application to the Ultra High Resolution Display", 2016 SID Simposium Digest of Technical Papers.

*Primary Examiner* — Thinh T Nguyen

(57) ABSTRACT

A thin film transistor (TFT) to control a light emitting diode (LED) or an organic light emitting diode (OLED) includes a channel region configured as a saddle channel extending between the drain region and the source region of the TFT. The saddle channel is formed by deposition of channel material on a fin structure, and the contour of the saddle channel is defined by the contour of the fin structure. Deposition of the channel material for the saddle channel may be performed by: (i) atomic layer deposition (ALD) of amorphous silicon; (ii) ALD of amorphous silicon followed by annealing to form polycrystalline silicon; or (iii) deposition of indium gallium zinc oxide (IGZO) material by one of ALD, plasma-enhanced atomic layer deposition (PEALD), chemical vapor deposition (CVD), or plasma-enhanced chemical vapor deposition (PECVD).

16 Claims, 15 Drawing Sheets

(56) References Cited

U.S. PATENT DOCUMENTS

| | | | |
|---|---|---|---|
| 2008/0081420 A1* | 4/2008 | Kim | H01L 29/66795 438/268 |
| 2009/0108358 A1* | 4/2009 | Lee | H01L 29/66621 257/368 |
| 2010/0025740 A1* | 2/2010 | Lee | H01L 27/10823 257/288 |
| 2010/0072545 A1* | 3/2010 | Ryu | H01L 21/28211 257/334 |
| 2010/0151656 A1* | 6/2010 | Kim et al. | H01L 21/762 438/435 |
| 2011/0237037 A1* | 9/2011 | Park et al. | H01L 27/105 438/270 |
| 2012/0220102 A1* | 8/2012 | Or-Bach | H01L 21/76254 438/458 |
| 2012/0231572 A1* | 9/2012 | Or-Bach | H01L 31/0725 438/73 |
| 2012/0273850 A1* | 11/2012 | Chun | H01L 29/772 257/288 |
| 2013/0049103 A1* | 2/2013 | Schloesser | H01L 27/10876 257/330 |
| 2015/0214314 A1* | 6/2015 | Oh | H01L 29/4236 257/330 |
| 2017/0133377 A1* | 5/2017 | Glass | H01L 29/66545 |

* cited by examiner

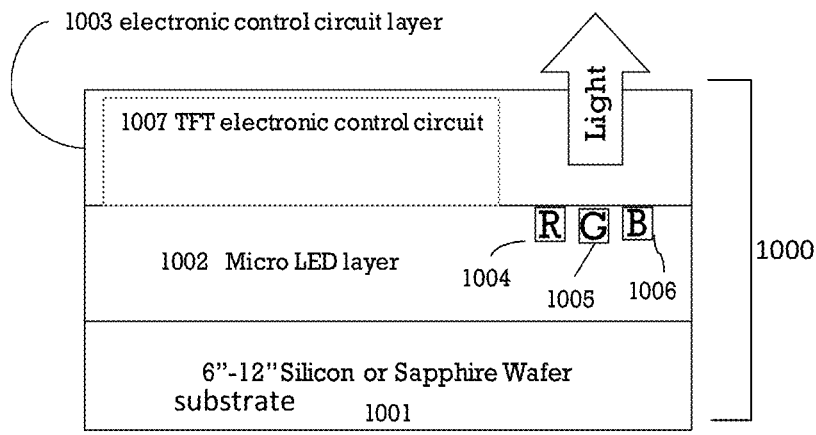
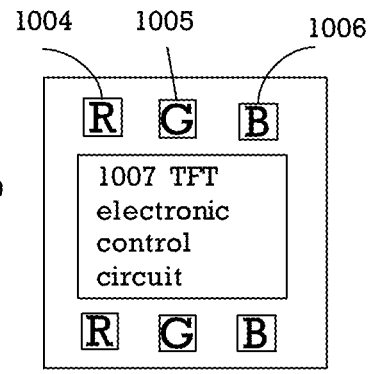
Fig. 1a                                   Fig. 1b
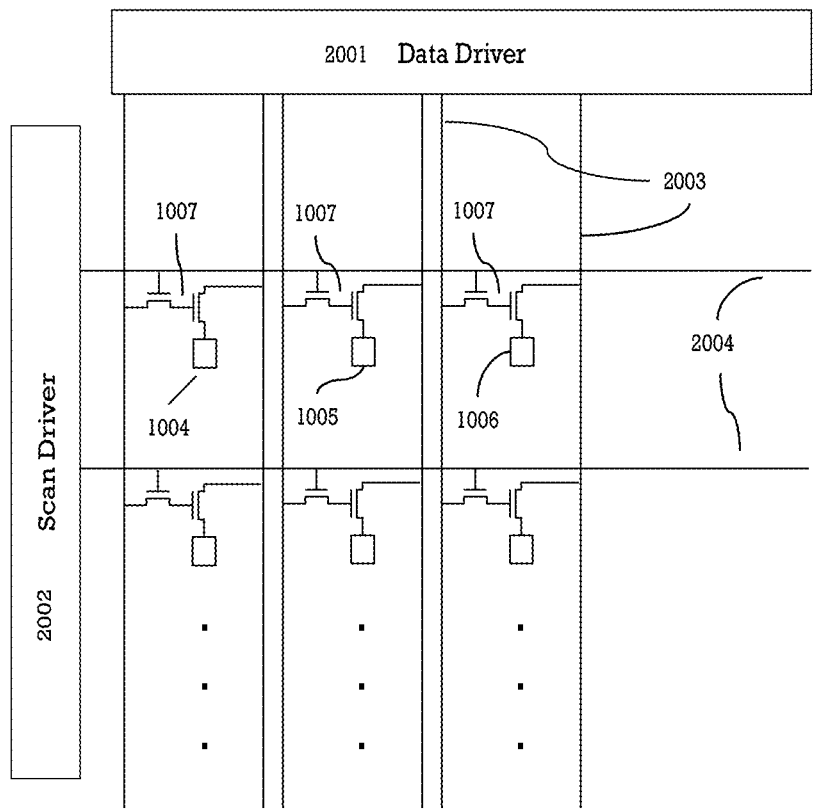
Fig. 2

SADDLE CHANNEL THIN FILM TRANSISTOR FOR DRIVING MICRO LEDS OR OLEDS IN ULTRAHIGH RESOLUTION DISPLAYS

TECHNICAL FIELD

Embodiments herein generally relate to thin film transistors (TFTs) and particularly to TFTs for controlling micro light emitting diodes (LEDs) or organic light emitting diodes (OLEDs) for ultra-high resolution displays.

BACKGROUND

Ultra-high resolution displays (e.g., pixels per inch (PPI) >2000) are required for virtual reality (VR), augmented reality (AR), and hologram displays. Currently, for large-area, active-matrix displays, lithographic techniques are constrained to 0.5 to 1 µm or larger features due to stringent requirements regarding photo-etching precision, TFT yield, costs, etc. Consequently, the advanced lithography for sub-micron to nano integrated circuits processes is generally not applicable to the production of large-are electronics, which means the channel length of the TFT may be no shorter than about 0.5 µm. This constraint is significant as modern trends require TFTs with ever smaller footprint for increasing PPI requirements for displays.

BRIEF DESCRIPTION OF THE DRAWINGS

FIG. 1a illustrates a layer sequence of a micro display device including micro LEDs and TFT electronic control circuit according to an embodiment.

FIG. 1b illustrates a top view of the micro display including micro LEDs and TFT electronic control circuit according to an embodiment.

FIG. 2 illustrates a block diagram of the connection amongst driver circuits, TFT electronic control circuits, and micro LEDs according to an embodiment.

DETAILED DESCRIPTION

Figure 3:
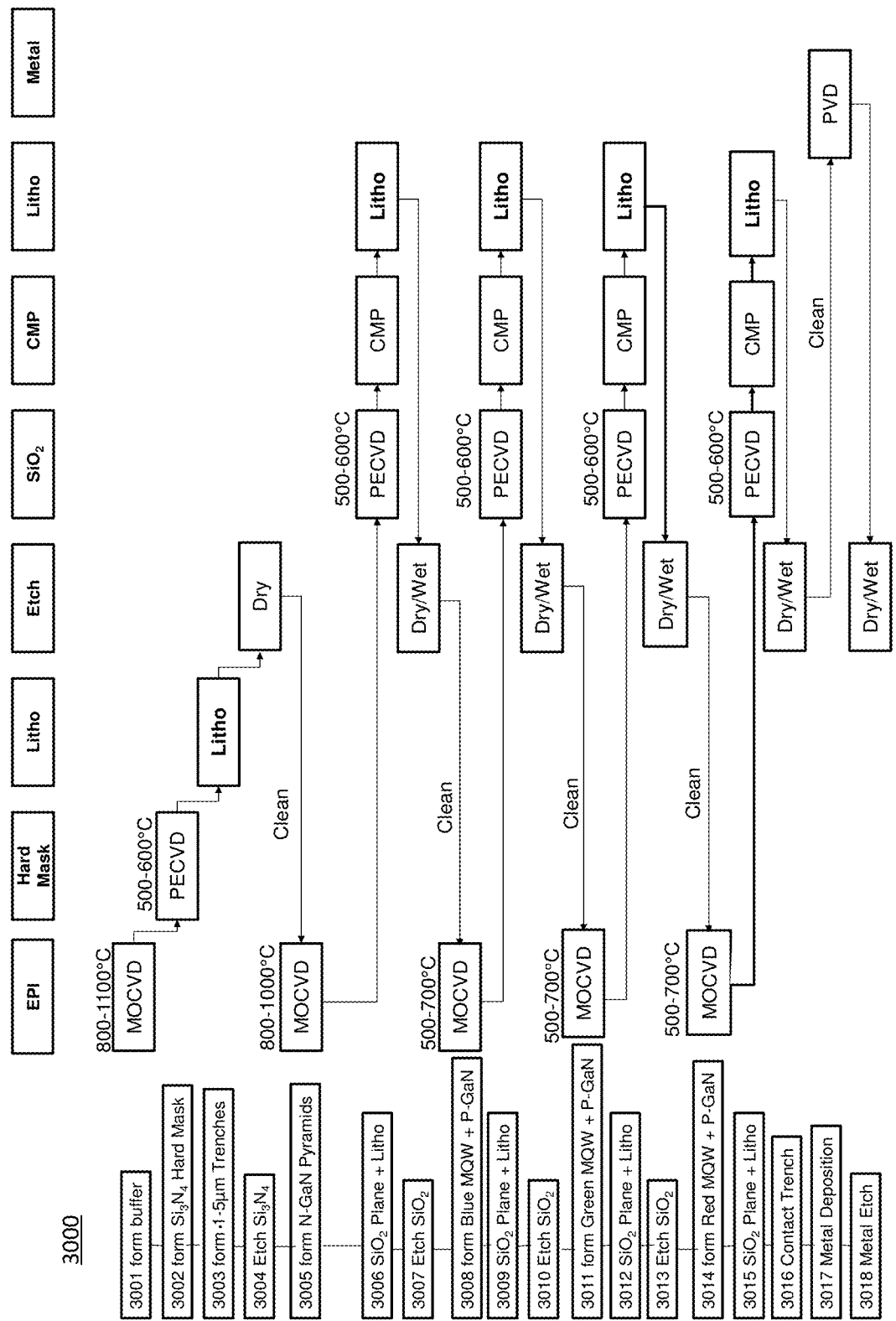
FIG. 3 illustrates a logic flow of a method for producing micro LEDs according to an embodiment.

Various embodiments may be generally directed to thin film transistors (TFTs) forming electronic control circuits for controlling micro light emitting diodes (LEDs) or organic light emitting diodes (OLEDs), e.g., for ultra-high resolution displays. In particular, the present disclosure may be implemented to produce saddle channel TFTs. The saddle channel TFTs may be provided in conjunction with micro LEDs built on silicon or sapphire substrate, for example. The saddle channel TFTs may also be provided in conjunction with micro OLEDs. The ultra-high resolution displays may include red, green, and blue micro LEDs or micro OLEDs, for example, and the electronic control circuits include TFTs with Indium gallium zinc oxide (IGZO), or any other doped zinc-oxide channels configured as saddle channels. Doping of ZnO channel may include one or more of the following elements: Ti, Al, Ga, In, Ta, or Hf.

FIG. 1a illustrates a layer sequence of a micro display 1000 including micro LEDs and electronic control circuits made of TFTs according to an embodiment. Starting with a substrate wafer 1001, which may be silicon, silicon carbide, or sapphire, for example, a micro LED layer 1002 is built on top of the substrate wafer 1001. The micro LED layer 1002 includes red (R) micro LEDs 1004, green (G) micro LEDs 1005 and blue (B) micro LEDs 1006, which may be produced using nanowire or micro pyramid approach, for example. It should be readily apparent that multiple R, G, and B micro LEDs 1004-1006 may be provided. It should be noted that R, G, and B colors for the micro LEDs 1004-1006 are merely examples, and other colors and shades may be readily implemented. For example, yellow and cyan micro LEDs may be provided. The examples are not limiting in this context. After the R, G, and B micro LEDs 1004-1006 of the layer 1002 are produced on the substrate wafer 1001, an electronic control circuit layer 1003 is produced above the micro LED layer 1002. The electronic control circuit layer 1003 includes electronic control circuits 1007 made of TFTs, which electronic control circuits 1007 may be positioned at a laterally different area from the micro LEDs 1004-1006 of the layer 1002 and paths of light emissions from the micro LEDs 1004-1006 to prevent light blocking by the TFTs of the electronic control circuits 1007. This is also shown in FIG. 1B, which illustrates the relative lateral positions of the TFT electronic control circuits 1007 and the R, G, and B micro LEDs 1004-1006 as viewed from the top perspective.

FIG. 2 illustrates the connection of the TFT electronic control circuits 1007 to the R, G, B micro LEDs 1004-1006 and to driver circuits, e.g., scan driver 2002 and data driver 2001, according to an embodiment. The TFTs of the TFT electronic control circuits 1007 are connected to associated R, G, B micro LEDs 1004-1006, as well as to data lines 2003 and gates lines 2004, which data lines and gates lines are in turn connected to data driver 2001 and scan driver 2002, respectively. In this manner, the timing of the TFT switching is controlled by the data driver 2001 and scan driver 2002, which data driver 2001 and scan driver 2002 may be implemented by crystalline silicon complementary metal-oxide-semiconductor (CMOS) integrated circuits. The number of TFTs depicted in FIG. 2 in connection with R, G, B micro LEDs 1004-1006 is purely exemplary, and different numbers of TFTs may be provided. For example, the TFT electronic control circuit per micro LED may include 4 TFTs. Examples are not limited in this context.

The process logic flow 3000 for manufacturing R, G, and B micro LEDs on a wafer is described in greater detail by reference to FIGS. 3 and 4a-4h. For the sake of clarity, the process logic flow 3000 is summarized on the left side of FIG. 3 as numbered blocks, and additional information regarding each numbered block is shown on the right side of FIG. 3. In addition, FIGS. 4a-4h illustrate cross-sectional views of component layers at various stages of manufacturing R, G, B micro LEDs.

In block 3001 of FIG. 3, a buffer layer (4001 shown in FIG. 4a) is formed on a substrate (1001 shown in FIG. 4a) by metalorganic chemical vapor deposition (MOCVD) at 800-1100° C. In block 3002 of FIG. 3, $Si_3N_4$ hard mask (4002 shown in FIG. 4a) is formed on top of the buffer layer (4001 shown in FIG. 4a) by plasma-enhanced chemical vapor deposition (PECVD) at 500-600° C. In block 3003 of FIG. 3, 0.1-5 μm width trenches (4003 shown in FIG. 4a) are formed in the $Si_3N_4$ hard mask by photolithography. Subsequently, dry etching of $Si_3N_4$ hard mask is performed in block 3004 of FIG. 3, followed by block 3005 in which N—GaN pyramids (4004 shown in FIG. 4b) are formed by metalorganic chemical vapor deposition (MOCVD) at 800-1100° C. In block 3006, $SiO_2$ layer (4050 shown in FIG. 4c) is formed on top of the $Si_3N_4$ hard mask and the N—GaN pyramids by plasma-enhanced chemical vapor deposition (PECVD) at 500-600° C., followed by chemical-mechanical planarization (CMP) and photolithography.

After etching of the $SiO_2$ layer in block 3007 of FIG. 3, blue multiple quantum well (MQW) (4005 shown in FIG. 4c) and P—GaN region (4006 shown in FIG. 4c) are formed in block 3008 on top of the N—GaN pyramid for the blue micro LED by MOCVD at 500-700° C. In block 3009, planarization of $SiO_2$ layer is repeated by PECVD at 500-600° C., followed by CMP and photolithography. After etching of the $SiO_2$ layer in block 3010 of FIG. 3, green multiple quantum well (MQW) (4007 shown in FIG. 4d) and P—GaN region (4008 shown in FIG. 4d) are formed in block 3011 on top of the N—GaN pyramid for the green micro LED by MOCVD at 500-700° C. In block 3012, planarization of $SiO_2$ layer is repeated by PECVD at 500-600° C., followed by CMP and photolithography. After etching of the $SiO_2$ layer in block 3013 of FIG. 3, red multiple quantum well (MQW) (4009 shown in FIG. 4e) and P—GaN region (4010 shown in FIG. 4e) are formed in block 3014 on top of the N—GaN pyramid for the red micro LED by MOCVD at 500-700° C. Planarization of $SiO_2$ layer (4050 shown in FIG. 4f) is repeated in block 3015 by PECVD at 500-600° C., followed by CMP and photolithography. Subsequently, contact trenches (4011 shown in FIG. 4g) are formed in block 3016 by etching, followed by formation of transparent metal (4012 shown in FIG. 4h) in the contact trenches by physical vapor deposition (PVD) in block 3017 and metal etching in block 3018.

Figure 4A:
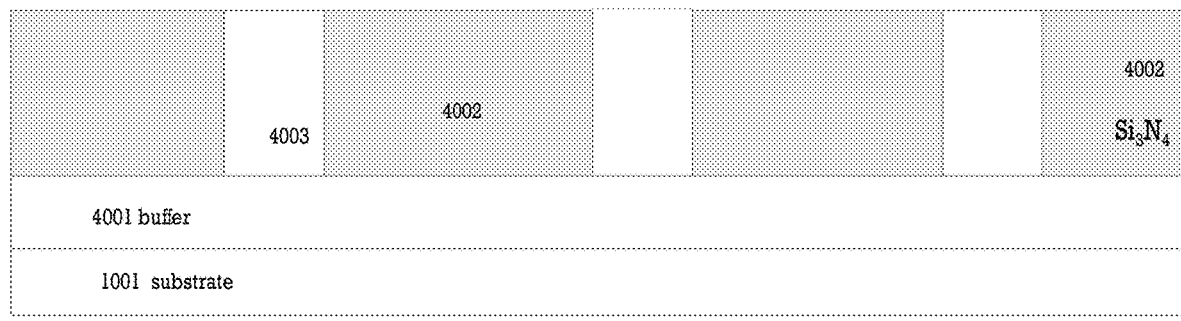
FIGS. 4a-4h illustrate cross-sectional views of component layers at different stages of manufacturing a micro LED according to an embodiment.
Figure 4B:
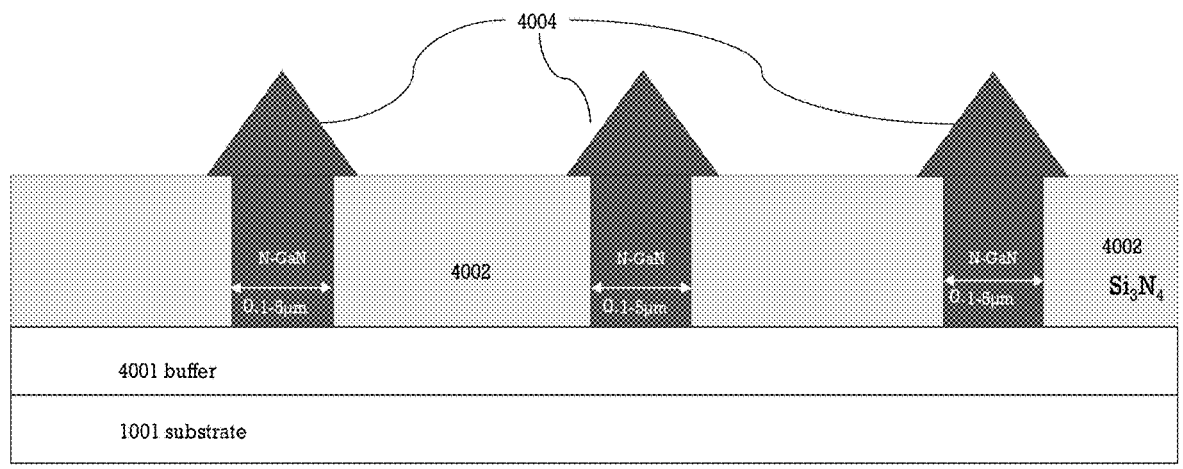
Figure 4C:
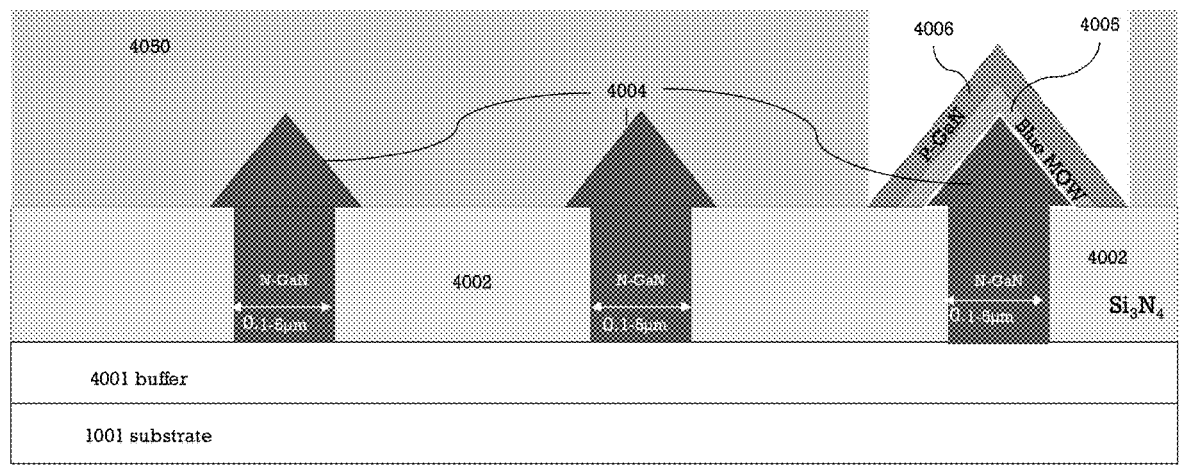
Figure 4D:
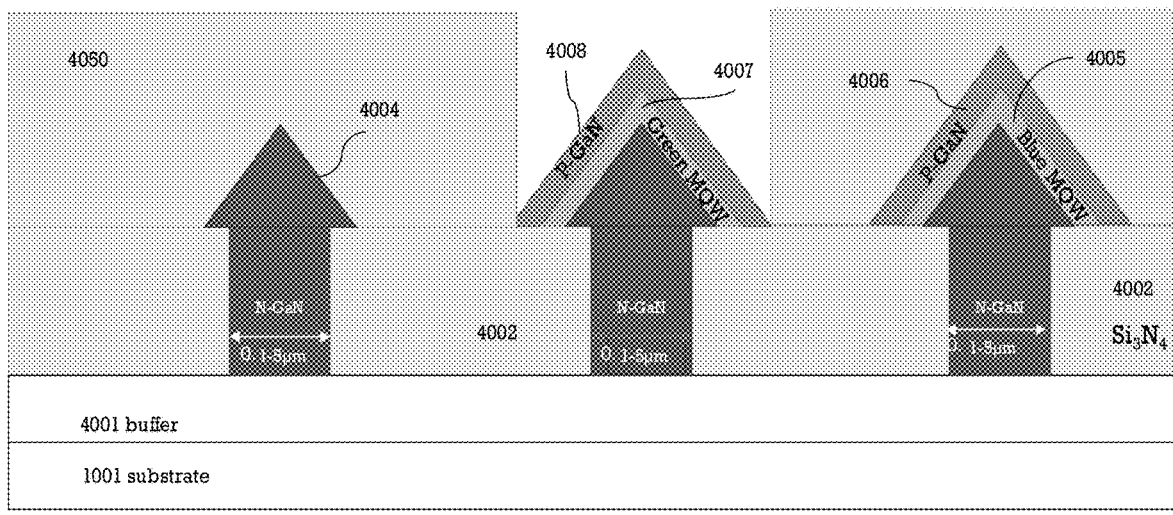
Figure 4E:
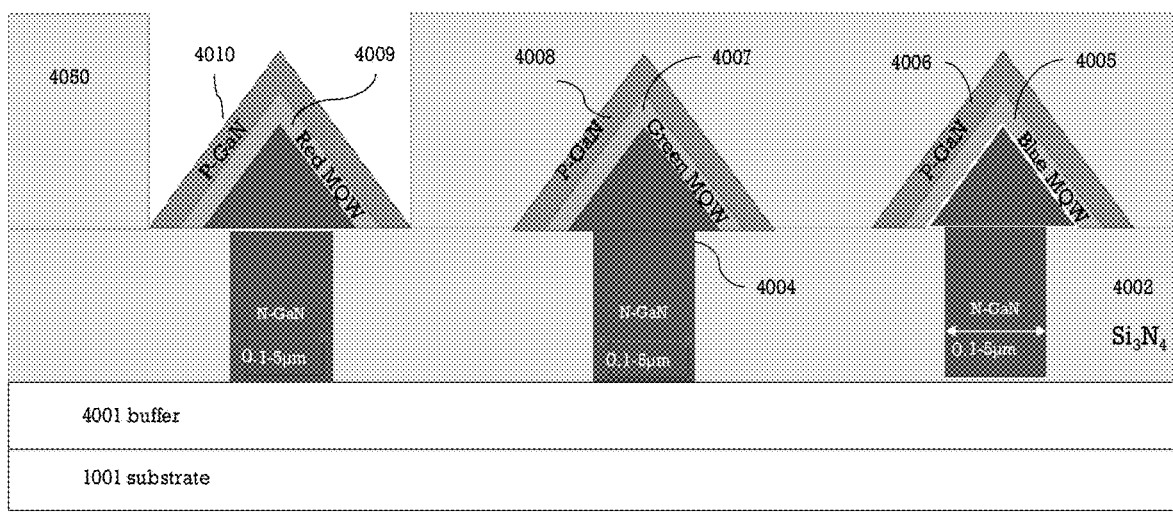
Figure 4F:
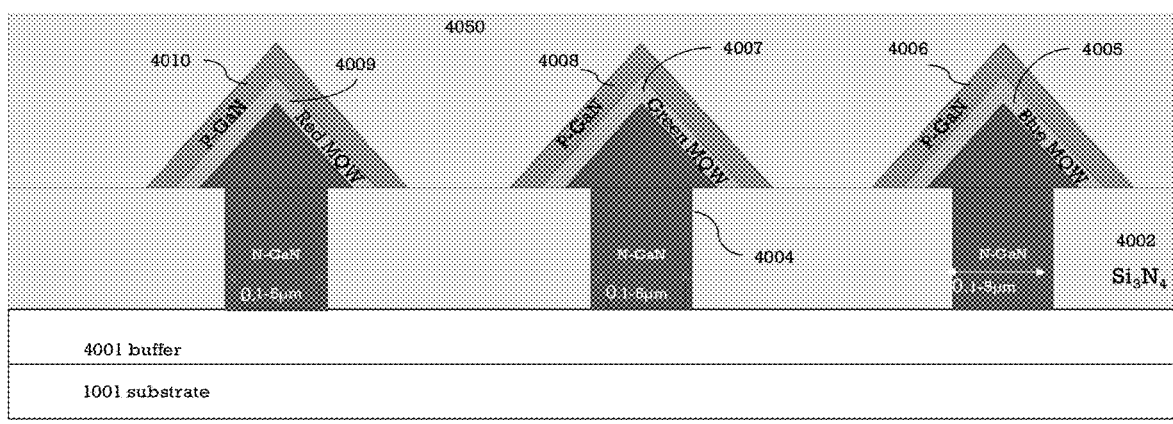
Figure 4G:
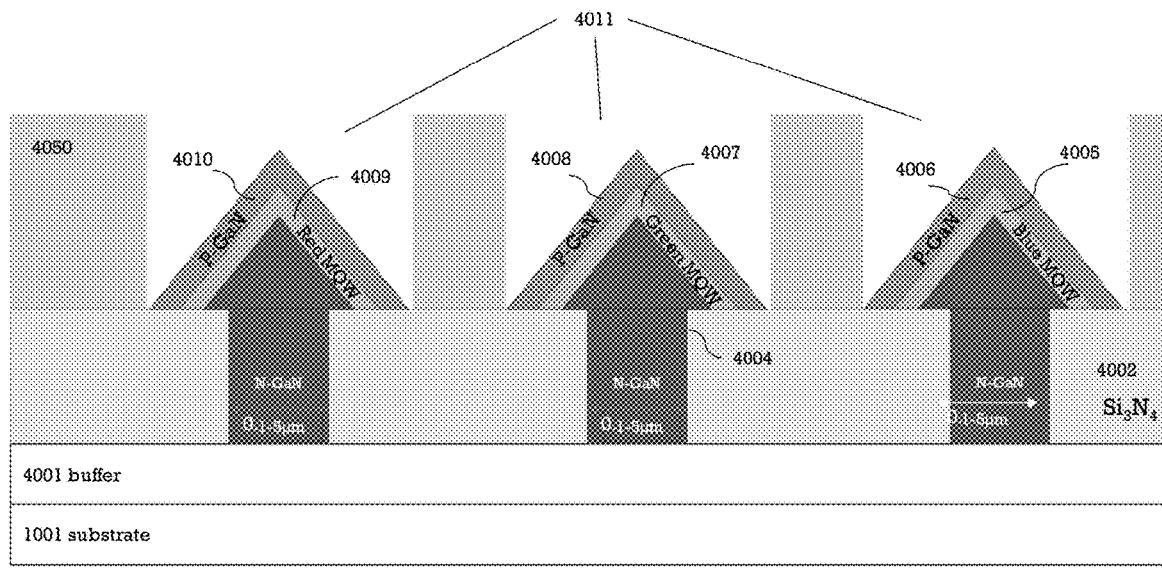
Figure 4H:
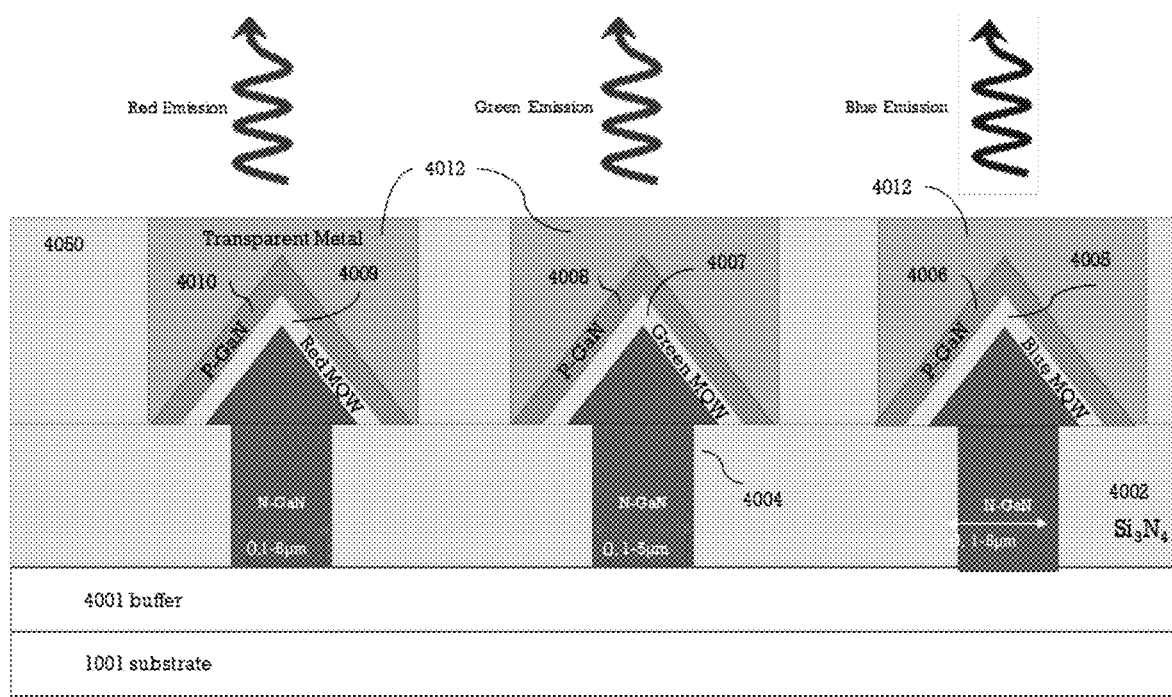

The layer configuration shown in FIG. 4h corresponds to the substrate 1001 and micro LED layer 1002 shown in FIG. 1a. The portion including red MQW 4009 and P—GaN region 4010 in FIG. 4h corresponds to the red micro LED 1004 shown in FIGS. 1a and 1b; the portion including green MQW 4007 and P—GaN region 4008 in FIG. 4h corresponds to the green micro LED 1005 shown in FIGS. 1a and 1b; and the portion including blue MQW 4005 and P—GaN region 4006 in FIG. 4h corresponds to the blue micro LED 1006 shown in FIGS. 1a and 1b. As noted above, red, green and blue colors for the micro LEDs 1004-1006 are merely examples, and other colors and shades may be readily implemented.

After the layer configuration shown in FIG. 4h (corresponding to the substrate 1001 and micro LED layer 1002 shown in FIG. 1a) has been produced, the electronic control circuit layer 1003 including TFT electronic control circuit 1007 schematically shown in FIG. 1a may be produced on top of the micro LED layer. In order to fit all transistors of the electronic control circuit 1007 associated with a micro LED in a very small pixel required for ultra-high PPI displays, use of small footprint TFTs is necessary.

Some of the lateral TFT configurations include back channel etch (BCE) TFT and self-aligned TFT. In the traditional, lateral TFT configurations for pixelated active-matrix imagers, each TFT occupies part of the pixel area as a switch for the micro LED. As a result, the TFT size imposes a limit to the array resolution, since the pixel fill factor, defined as a ratio of the emissive element (micro LED) area to the pixel area, diminishes rapidly as pixel pitch is reduced below 50 μm.

In addition, to eliminate the dependence of the channel length on the photolithography technique, a vertical thin film transistor (VTFT) structure has been proposed wherein channel material is oriented in the vertical direction. Rather than being laid out laterally, components of a VTFT are layered. In particular, a doped source ohmic contact layer and a similarly doped drain ohmic contact layer are stacked on either side of a dielectric in a sandwich structure. An active channel layer is provided along the side of the sandwich structure, and a gate is provided along the active channel layer. The thickness of the dielectric is then the determining factor for the length of the channel, rather than lithographic techniques. Although the VTFT structure allows the channel length to be scaled down, below that allowed by lateral TFTs, there are several deficiencies. It is not easy to manufacture VTFTs, and VTFTs suffer from high off-state leakage due to short channel effects. In addition, IGZO VTFTs exhibit large gate-to-drain and drain-to-source capacitances.

FIGS. 5a-5i illustrate cross-sectional views of component layers at different stages of manufacturing TFTs of the TFT electronic control circuit on top of the micro LED layer according to an embodiment in which the TFTs include a channel configured as a saddle channel. Although FIGS. 5a-5i show the manufacturing process flow for two TFTs of the TFT electronic control circuit for the sake of clarity, it should be readily apparent that the illustrated manufacturing process flow may be applied to different numbers of TFTs. In addition, a process logic flow 500 for manufacturing the TFTs of the TFT electronic control circuit on top of the micro LED layer is shown in FIG. 9, which process logic flow 500 corresponds to the manufacturing process flow depicted in FIGS. 5a-5i.

Figure 5A:
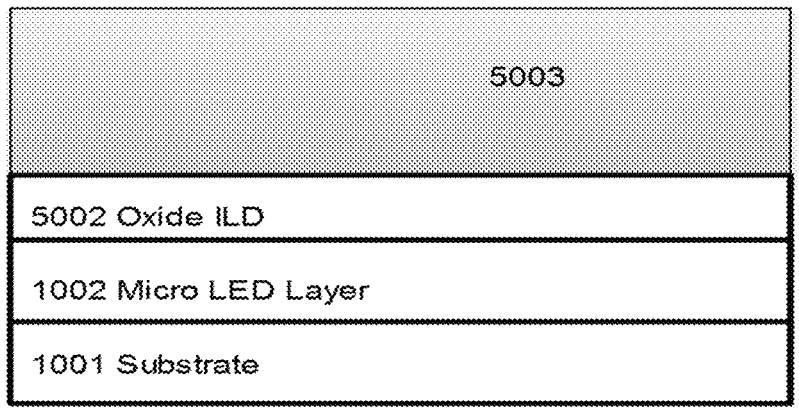
FIGS. 5a-5i illustrate cross-sectional views of component layers at different stages of manufacturing TFTs of the TFT electronic control circuit according to an embodiment.
Figure 5B:
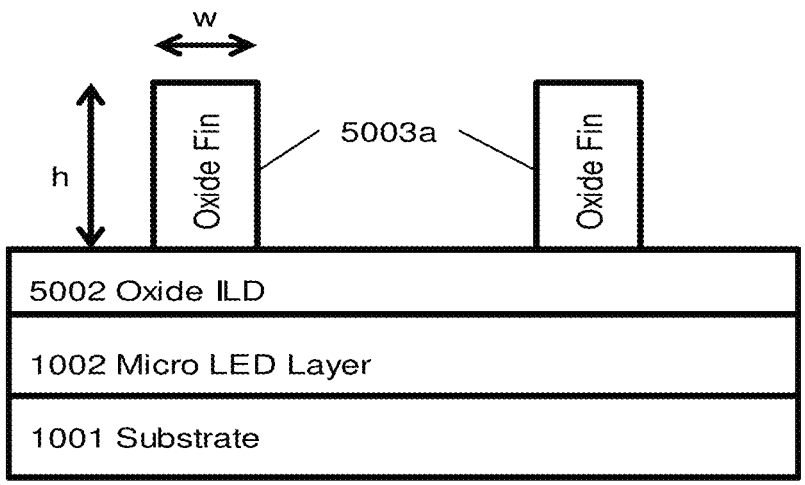
Figure 5C:
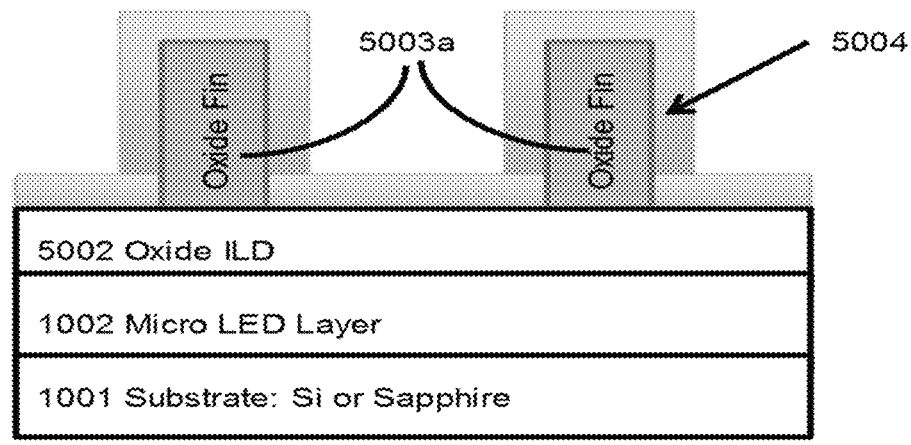
Figure 8:
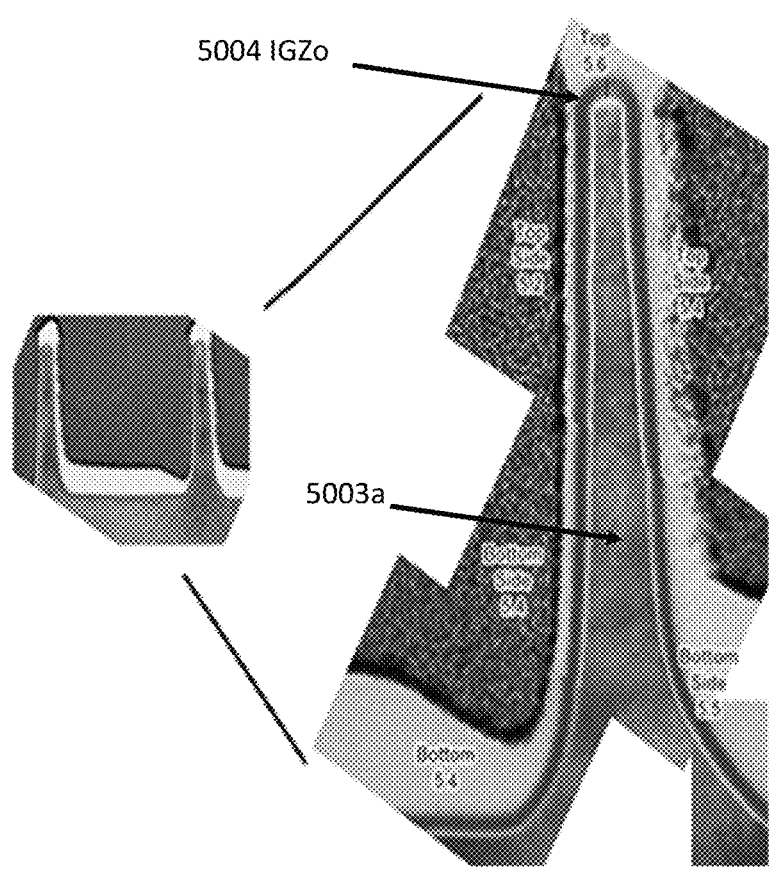
FIG. 8 illustrates a cross-sectional view of an oxide fin with IGZO deposit.
Figure 9:
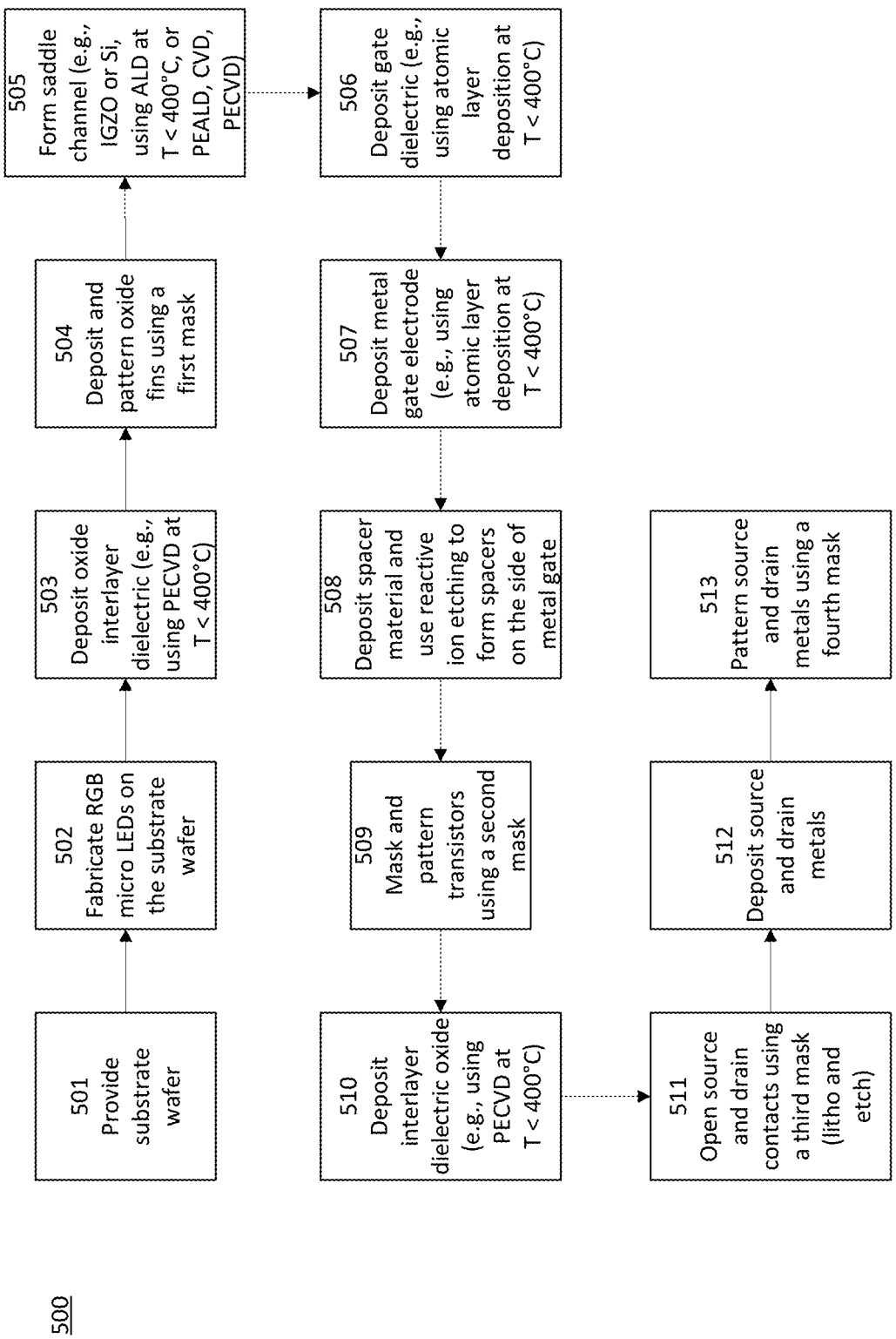
FIG. 9 illustrates a logic flow of a method for producing a TFT of the TFT electronic control circuit provided on top of the micro LED layer.

As shown in FIG. 5a and block 501 of FIG. 9, substrate wafer 1001, which may be silicon or sapphire, for example, is initially provided, followed by fabrication of R, G, B micro LEDs of the micro LED layer 1002 on the substrate wafer 1001 (as shown in FIG. 5a and block 502 of FIG. 9). Next, as shown in FIG. 5a and block 503 of FIG. 9, oxide interlayer dielectric (ILD) layer 5002 is deposited on top of the micro LED layer 1002 using, e.g., plasma-enhanced chemical vapor deposition (PECVD) at a temperature <400° C. The oxide ILD layer 5002 may be HfZrO, $ZrO_2$, $HfO_2$, $Al_2O_3$, $SiO_2$, etc., and other suitable deposition techniques for the ILD layer 5002 may be plasma-enhanced atomic layer deposition (PEALD), chemical vapor deposition (CVD) or atomic layer deposition (ALD). At block 504 of FIG. 9, layer 5003 (e.g., $SiO_2$, $Al_2O_3$, $Si_3N_4$ or other suitable dielectric) is deposited on the oxide ILD 5002 (shown in FIG. 5a) and patterned using a first mask to generate oxide fins 5003a (shown in FIG. 5b). Subsequently, as shown in FIG. 5c and block 505 of FIG. 9, channel layer 5004 is deposited on the oxide fins 5003a by a suitable deposition technique, e.g., atomic layer deposition (ALD) at a temperature <400° C. The channel layer 5004 may be Si, ZnO, doped ZnO (e.g., ZnO doped with Indium, Gallium, Aluminum, Titanium), or other suitable channel material. One example of the saddle channel is IGZO channel deposited using ALD at a temperature <400° C. In addition to ALD, other suitable deposition technique for the channel layer 5004 may be plasma-enhanced atomic layer deposition (PEALD), chemical vapor deposition (CVD) or plasma-enhanced chemical vapor deposition (PECVD). In the example case of using Si for the channel, Si may be amorphous (deposited using ALD), or polycrystalline silicon formed by converting amorphous Si by crystallization anneal. FIG. 8 shows a cross-sectional view of an experimental demonstration of conformal deposition of IGZO layer 5004 by ALD on an oxide fin 5003a.

Figure 5D:
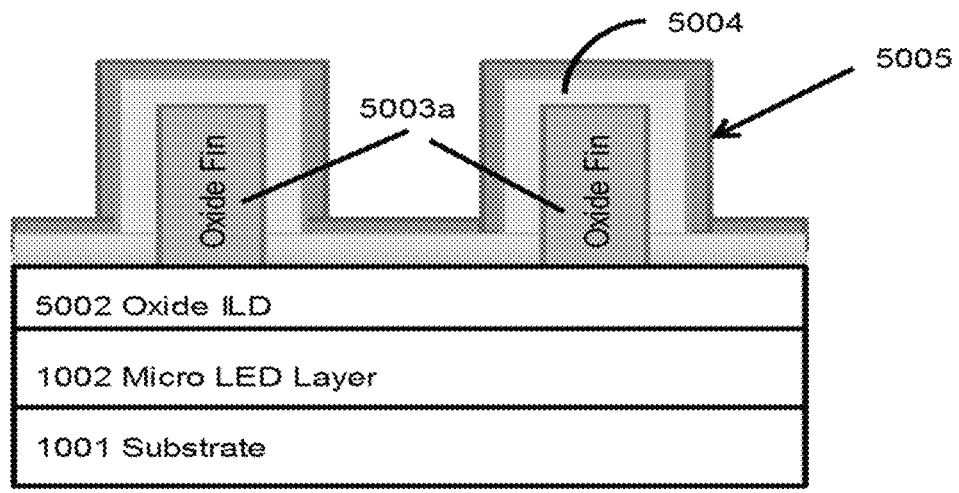
Figure 5E:
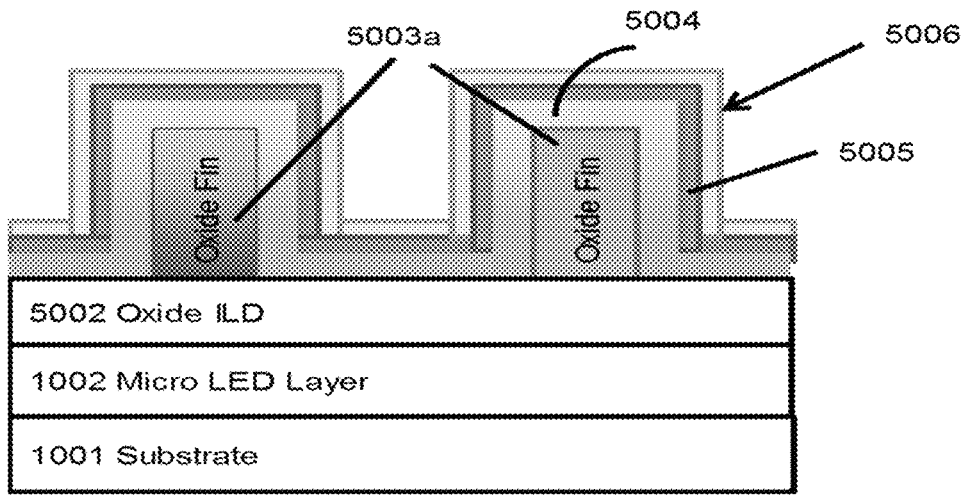
Figure 5F:
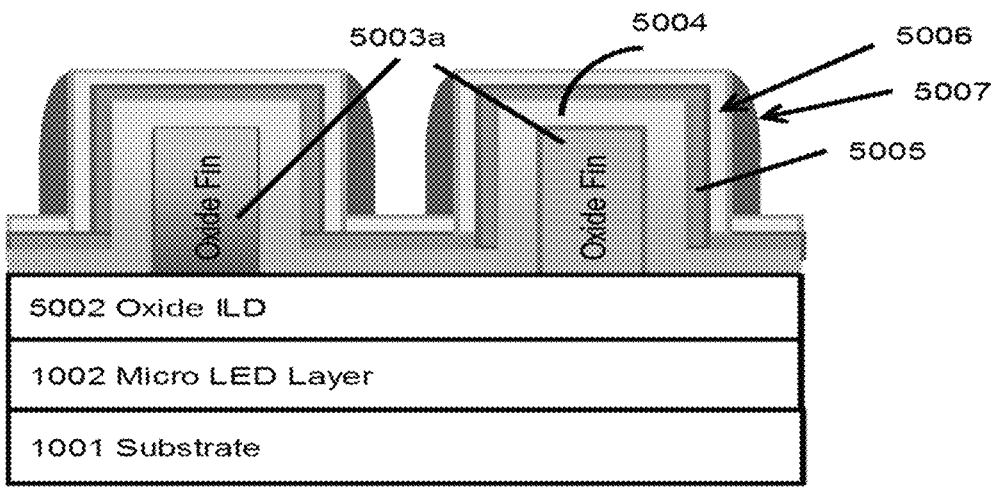
Figure 5G:
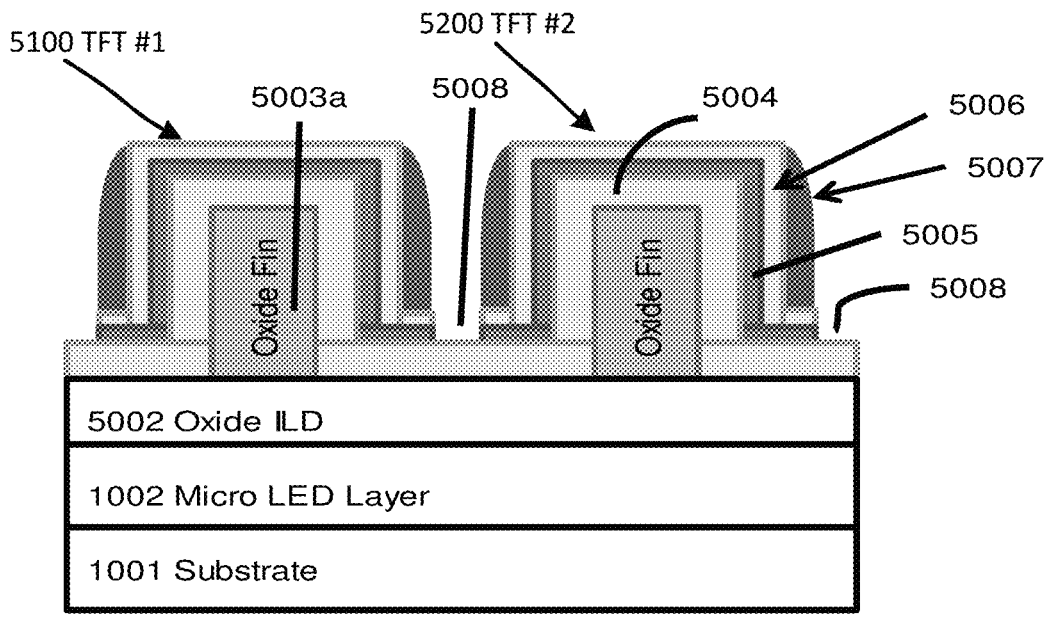
Figure 5H:
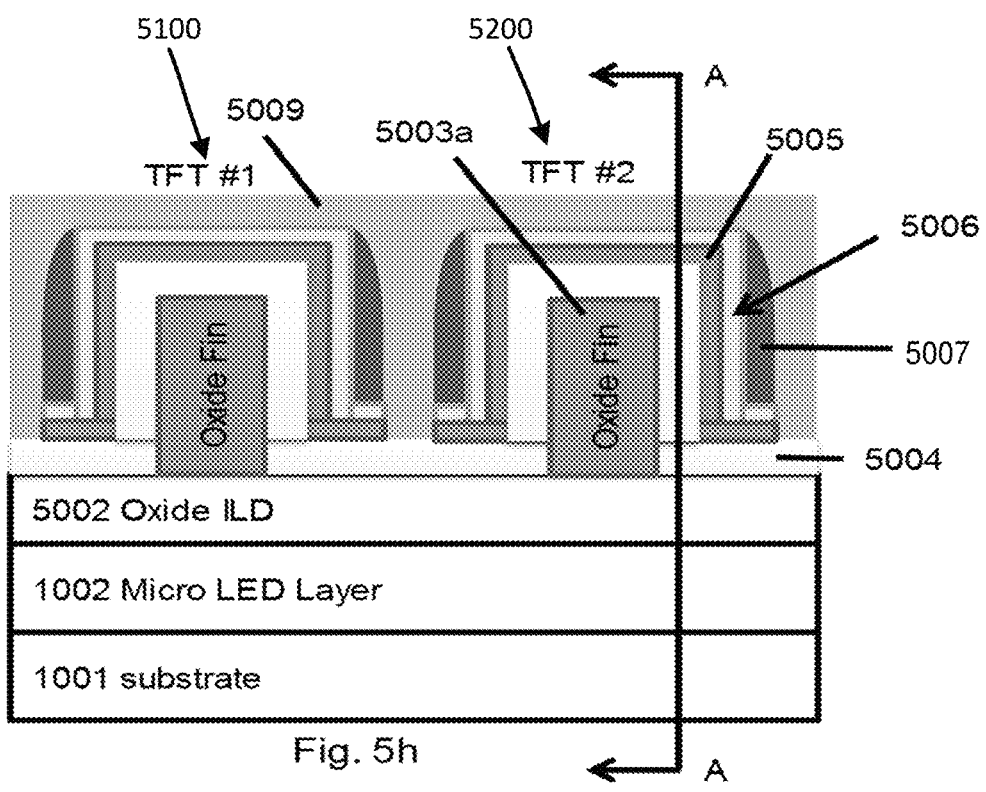
Figure 5I:
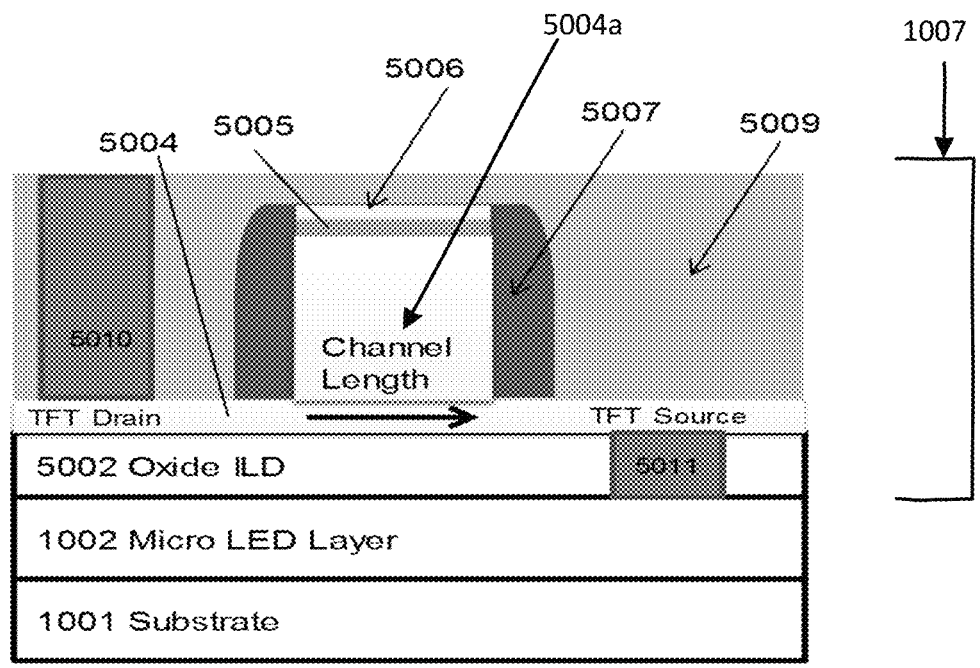

Next, as shown in FIG. 5d and block 506 of FIG. 9, gate dielectric 5005 is deposited on the channel layer 5004 by a suitable deposition technique, e.g., atomic layer deposition (ALD) at a temperature <400° C. The gate dielectric material 5005 may include a high-k dielectric, e.g., HfZrO, $ZrO_2$, $HfO_2$, $Al_2O_3$, or $TiO_2$, one or more of which may be combined with Si, $SiO_2$, and/or $Si_3N_4$. At block 507 of FIG. 9 (corresponding to FIG. 5e), metal gate electrode 5006 is deposited by a suitable deposition technique, e.g., atomic layer deposition (ALD) at a temperature <400° C. Metal gate electrode 5006 may be Mo, W, Cu, etc. Subsequently, at block 508 of FIG. 9, spacer material (e.g., $Si_3N_4$, SiOCN, etc.) is deposited and etched using reactive ion etching to form spacers 5007 on the side of the metal gate electrodes 5006 (as shown in FIG. 5f). Next, as shown in FIG. 5g and block 509 of FIG. 9, individual TFTs 5100 and 5200 are patterned using a second mask (patterned regions 5008 shown in FIG. 5g). As shown in FIG. 5h and block 510 of FIG. 9, interlayer dielectric (e.g., $SiO_2$, $SiO_x$, SiOC, etc.) 5009 is then deposited on top of, and around, the TFTs 5100 and 5200. Next, at block 511 of FIG. 9, the source and drain contacts are opened by photolithography and etching using a third mask, followed by block 512 at which source and drain metals are deposited, and block 513 at which drain metal and source metal are patterned. The drain metal 5010 and source metal 5011 are shown in FIG. 5i, which illustrates a cross-sectional view taken along line A-A shown in FIG. 5h. The resulting TFT electronic control circuit 1007 including TFTs on top of the micro LED layer is shown in FIG. 5i, which figure shows the saddle channel region 5004a and the channel length. The TFT shown in FIG. 5i has a top-gate structure. However, a bottom-gate structure may also be implemented.

Figure 6A:
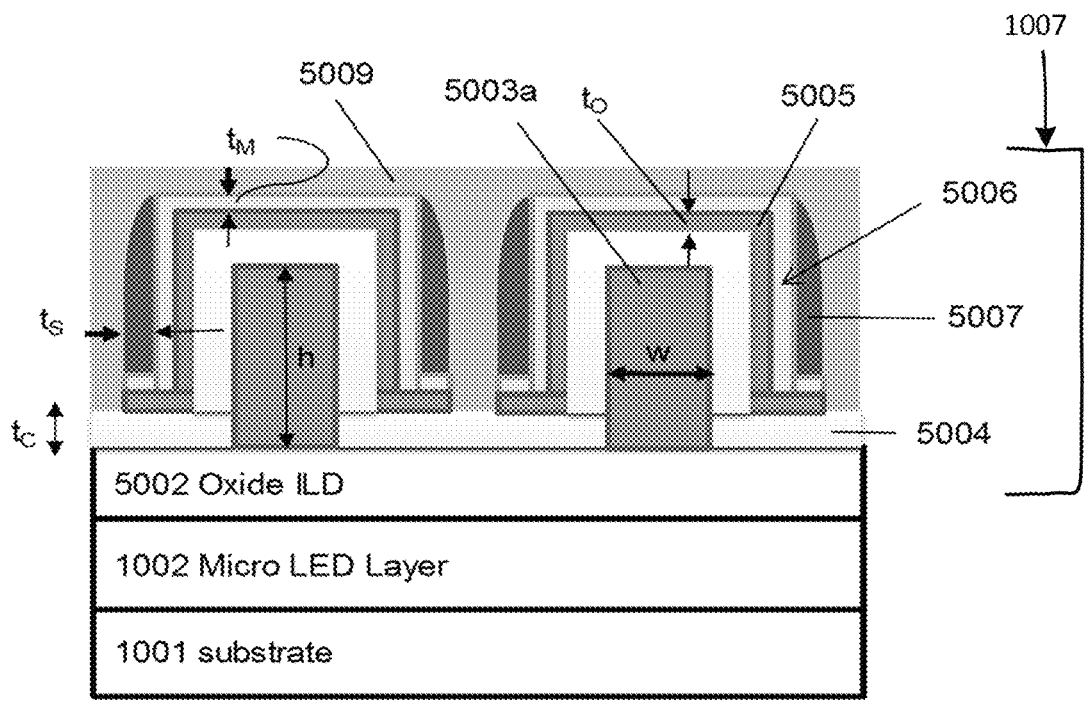
FIG. 6a illustrates a cross-sectional view of component layers of TFTs provided on top of the micro LED layer according to an embodiment.
Figure 6B:
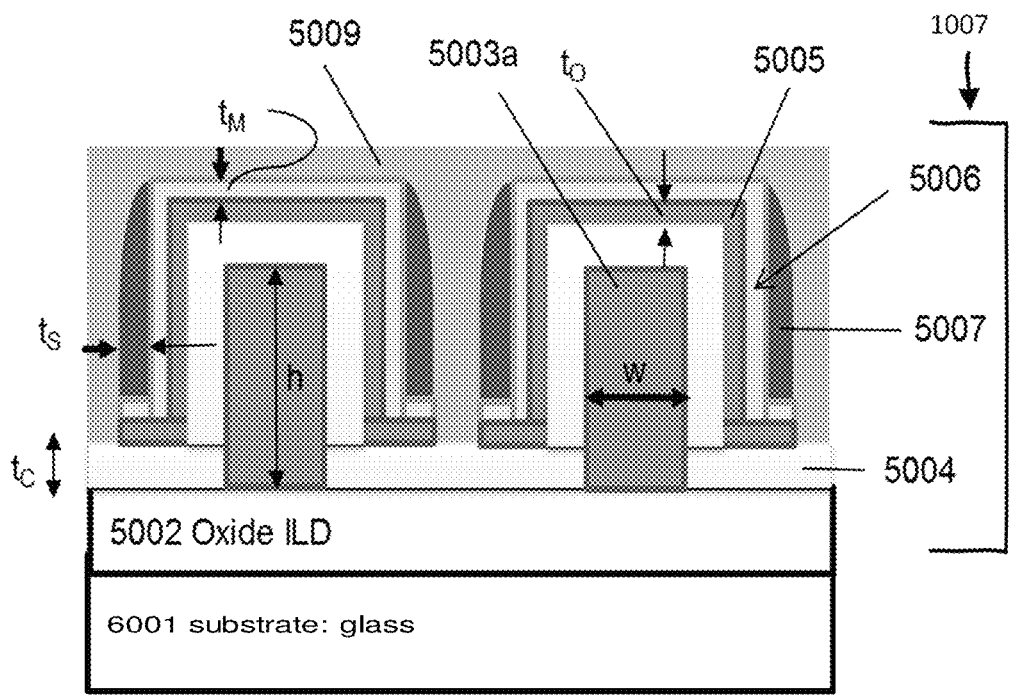
FIG. 6b illustrates a cross-sectional view of component layers of TFTs provided on a glass substrate according to an embodiment.
Figure 7:
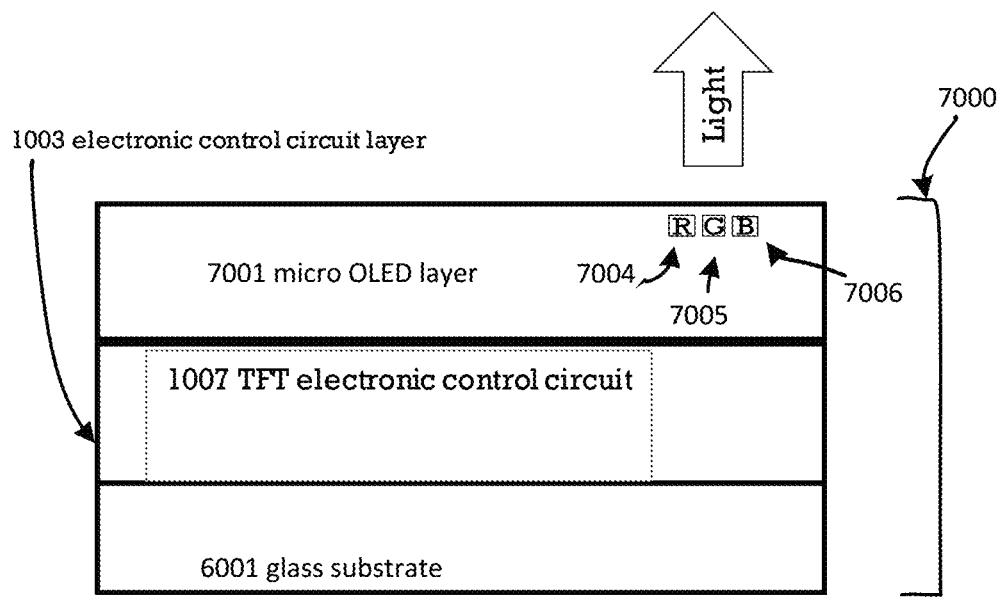
FIG. 7 illustrates a layer sequence of a micro display device including micro OLEDs and TFT electronic control circuit according to an embodiment.

FIG. 6b illustrates a cross-sectional view of TFT electronic control circuit 1007 provided on top of glass substrate 6001 according to an embodiment in which the TFTs include a channel configured as a saddle channel. As shown in FIG. 7, the TFT electronic control circuit 1007 provided on top of glass substrate 6001 may be used in conjunction with a micro OLED layer 7001 which is provided on top of the electronic control circuit layer 1003 including the TFT electronic control circuit 1007, thereby forming the micro display 7000. The micro OLED layer 7001 includes R, G, B micro OLEDs 7004-7006. The circuit connection shown in FIG. 2 applies similarly to the case of TFT electronic control circuit 1007 provided on top of glass substrate 6001, i.e., the TFTs are operatively coupled to the associated OLEDs and the driver lines. The manufacturing process flow for manufacturing TFT electronic control circuit 1007 provided on top of glass substrate 6001 as shown in FIG. 6b is substantially identical to the manufacturing process flow illustrated in FIGS. 5a-5i, with the following differences: (i) the micro LED layer 1002 shown in FIG. 5a is not present in the case of the glass substrate embodiment; and (ii) a micro OLED layer 7001 is provided on top of the electronic control circuit layer 1003 containing the TFT electronic control circuit 1007. The process logic flow 600 for manufacturing the TFTs of TFT electronic control circuit 1007 on top of glass substrate 6001 is shown in FIG. 10.

Figure 10:
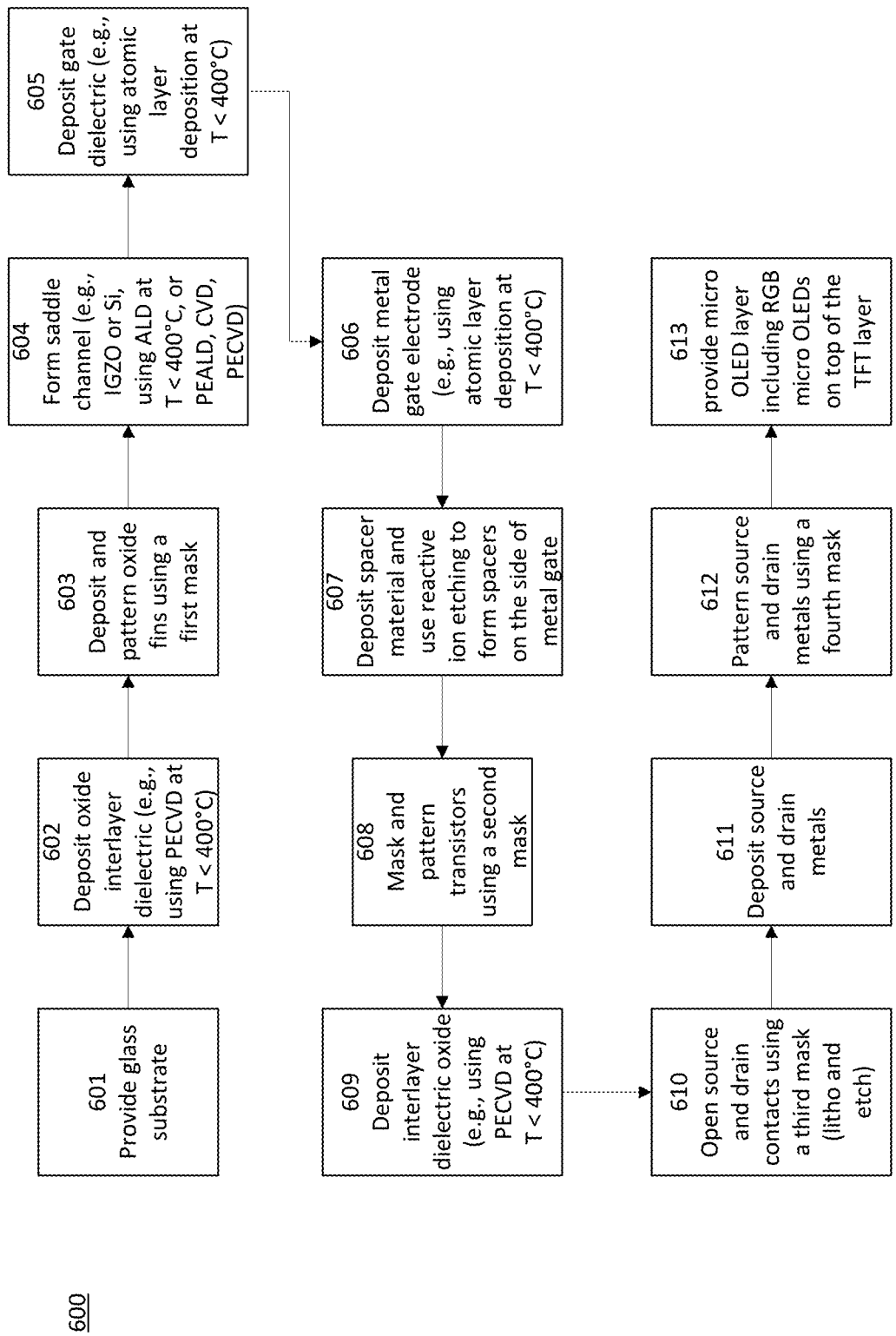
FIG. 10 illustrates a logic flow of a method for producing a TFT of the TFT electronic control circuit provided on top of a glass substrate.

As shown in block 601 of FIG. 10, glass substrate (6001 shown in FIG. 6b) is initially provided. Next, as shown in block 602 of FIG. 10, oxide interlayer dielectric (ILD) layer (corresponding to layer 5002 of FIG. 6b) is deposited on top of the glass substrate (6001 shown in FIG. 6b) using, e.g., plasma-enhanced chemical vapor deposition (PECVD) at a temperature <400° C. The oxide ILD layer 5002 may be HfZrO, $ZrO_2$, $HfO_2$, $Al_2O_3$, $SiO_2$, etc., and other suitable deposition techniques for the ILD layer 5002 may be plasma-enhanced atomic layer deposition (PEALD), chemical vapor deposition (CVD) or atomic layer deposition (ALD). At block 603 of FIG. 10, layer (corresponding to layer 5003 of FIG. 5a) (e.g., $Al_2O_3$, $SiO_2$, $Si_3N_4$ or other suitable dielectric) is deposited on the oxide ILD 5002 and patterned using a first mask to generate oxide fins (corresponding to 5003a shown in FIG. 5b). Subsequently, at block 604 of FIG. 10, channel layer (corresponding to 5004 shown in FIG. 5c) is deposited on the oxide fins 5003a by a suitable deposition technique, e.g., atomic layer deposition (ALD) at a temperature <400° C. The channel layer 5004 may be Si, ZnO, doped ZnO (e.g., ZnO doped with Indium, Gallium, Aluminum, Titanium), or other suitable channel material. One example of the saddle channel is IGZO channel deposited using ALD at a temperature <400° C. In addition to ALD, other suitable deposition technique for the channel layer 5004 may be plasma-enhanced atomic layer deposition (PEALD), chemical vapor deposition (CVD) or plasma-enhanced chemical vapor deposition (PECVD). In the example case of using Si for the channel, Si may be amorphous (deposited using ALD), or polycrystalline silicon formed by converting amorphous Si by crystallization anneal. FIG. 8 shows a cross-sectional view of an experimental demonstration of conformal deposition of IGZO layer 5004 by ALD on an oxide fin 5003a.

Next, at block 605 of FIG. 10, gate dielectric (corresponding to 5005 shown in FIG. 5d) is deposited on the channel layer (corresponding to 5004) by a suitable deposition technique, e.g., atomic layer deposition (ALD) at a temperature <400° C. The gate dielectric material 5005 may include a high-k dielectric, e.g., HfZrO, $ZrO_2$, $HfO_2$, $Al_2O_3$, or $TiO_2$, one or more of which may be combined with Si, $SiO_2$, and/or $Si_3N_4$. At block 606 of FIG. 10, metal gate electrode (corresponding to 5006 shown in FIG. 5e) is deposited by a suitable deposition technique, e.g., atomic layer deposition (ALD) at a temperature <400° C. Metal gate electrode 5006 may be Mo, W, Cu, etc. Subsequently, at block 607 of FIG. 10, spacer material (e.g., $Si_3N_4$, SiOCN, etc.) is deposited and etched using reactive ion etching to form spacers (corresponding to 5007 shown in FIG. 5f) on the side of the metal gate electrodes (5006 shown in FIG. 5f). Next, at block 608 of FIG. 10, individual TFTs (corresponding to 5100 and 5200 shown in FIG. 5g) are patterned using a second mask (patterned regions 5008 shown in FIG. 5g). Proceeding to block 609 of FIG. 10, interlayer dielectric, which may be, e.g., $SiO_2$, $SiO_x$, SiOC, etc., is then deposited on top of, and around, the TFTs 5100 and 5200. Next, at block 610 of FIG. 10, the source and drain contacts are opened by photolithography and etching using a third mask, followed by block 611 at which source and drain metals are deposited, and block 612 at which drain metal and source metal are patterned. The drain metal and the source metal correspond to drain metal 5010 and source metal 5011 shown in FIG. 5i, which illustrates a cross-sectional view taken along line A-A shown in FIG. 5h. The resulting TFT electronic control circuit including TFTs corresponds to TFT electronic control circuit 1007 including TFTs shown in FIG. 5i, which figure shows the saddle channel region 5004a and the channel length. Finally, as shown in FIG. 7 and block 613 of FIG. 10, micro OLED layer 7001 including R, G, B micro OLEDs 7004-7006 is provided on top of the TFT electronic control circuit layer 1003 including the TFT electronic control circuit 1007. It should be readily apparent that multiple R, G, B micro OLEDs 7004-7006 may be provided.

The saddle channel TFTs described above provide several advantages. The footprint of the saddle channel TFT with IGZO channel layer is approximately five times smaller than conventional lateral TFTs with IGZO channel layer for a given drive current. The saddle channel TFT provides higher current driving capability than conventional TFTs. The saddle channel TFT requires only four lithographic masks to fabricate, which is significantly less complex and less costly in comparison to low-temperature polycrystalline silicon (LTPS) TFT fabrication. The saddle channel TFT fabrication does not require any etch of IGZO material, resulting in high reliability of the TFT. For the saddle channel TFT, the IGZO channel layer is provided by atomic layer deposition (ALD), resulting in higher quality IGZO layer than in comparison to conventional IGZO channel TFTs made with sputtered IGZO, thereby providing better reliability. In addition, IGZO layer fabrication on a large size glass substrate is easier in comparison to LTPS, resulting in lower manufacturing cost. Furthermore, the saddle channel TFT may be used to drive both micro LED and OLED displays.

Described below is an exemplary estimation of the TFT footprint reduction factor based on typical values of TFT dimensions for a given target drive current of the TFT. FIG. 6a illustrates various dimensions of TFTs included in the TFT electronic control circuit 1007 and provided on top of the micro LED layer 1002, which layer 1002 is in turn provided on top of substrate 1001 made of silicon or sapphire, for example. The device configuration shown in FIG. 6a corresponds the device configuration shown in FIG. 5h. For the example case of saddle channel TFTs used to fabricate displays on 300 mm silicon wafers, the lithography technology can provide features as small as 250 nm. Table 1 lists the relevant parameters of the saddle channel TFT (corresponding to the TFTs shown in FIG. 6a) and conventional TFT for this example case:

TABLE 1

| Parameter | Saddle channel TFT | Conventional TFT |
| --- | --- | --- |
| Oxide Fin Width (nm) = w | 250 | |
| Oxide Fin Height (nm) = h | 300 | |
| Gate Oxide Thickness (nm) = $t_O$ | 30 | 30 |
| Metal Gate Thickness (nm) = $t_M$ | 30 | |
| Channel (IGZO) Thickness (nm) = $t_C$ | 20 | |
| Spacer Thickness (nm) = $t_S$ | 10 | |
| $W_{footprint}$ = Footprint Width (nm) | 430 | 2140 |
| Channel Length (nm) | 250 | 250 |

TABLE 1-continued

| Parameter | Saddle channel TFT | Conventional TFT |
| --- | --- | --- |
| $W_{eff}$ = Effective Width (nm) | 1070 | 2140 |
| Effective Mobility (cm$^2$/V-s) | 20 | 10 |
| VG-VT (V) | 3 | 3 |
| Drain Current (μA) | 89 | 89 |
| TFT Footprint (μm$^2$) | 0.3 | 1.6 |
| Footprint Reduction Factor | 5.0 | |

Footprint width ($W_{footprint}$) and effective width ($W_{eff}$) of each TFT may be calculated as follows:

$$W_{footprint} = w + 2(t_C + t_O + t_S + t_M)$$

$$W_{eff} = W_{footprint} + 2(h + t_C)$$

Using the parameters listed in Table 1, the calculated footprint area of the conventional TFT is 1.6 μm$^2$, while the calculated footprint area of the saddle channel TFT is 0.3 μm$^2$. Therefore, for this example case, the saddle channel TFT provides a footprint reduction factor of approximately 5.

FIG. 6b illustrates various dimensions of TFTs included in the TFT electronic control circuit 1007 and provided on top of substrate 6001 made of glass, for example. As shown in FIG. 7, the TFT electronic control circuit 1007 provided on top of glass substrate 6001 may be used in conjunction with a micro OLED layer 7001 which is provided on top of the electronic control circuit layer 1003 including the TFT electronic control circuit 1007. For the example case of saddle channel TFTs provided on glass substrate, the lithography technology for large glass can provide features as small as 1000 nm. Table 2 lists the relevant parameters of the saddle channel TFT (corresponding to the TFTs shown in FIG. 6b) and conventional TFT for this example case:

TABLE 2

| Parameter | Saddle channel TFT | Conventional TFT |
| --- | --- | --- |
| Oxide Fin Width (nm) = w | 1000 | |
| Oxide Fin Height (nm) = h | 500 | |
| Gate Oxide Thickness (nm) = $t_O$ | 30 | 30 |
| Metal Gate Thickness (nm) = $t_M$ | 30 | |
| Channel (IGZO) Thickness (nm) = $t_C$ | 20 | |
| Spacer Thickness (nm) = $t_S$ | 10 | |
| $W_{footprint}$ = Footprint Width (nm) | 1180 | 4440 |
| Channel Length (nm) | 1000 | 1000 |
| $W_{eff}$ = Effective Width (nm) | 2220 | 4440 |
| Effective Mobility (cm$^2$/V-s) | 20 | 10 |
| VG-VT (V) | 3 | 3 |
| Drain Current (μA) | 46 | 46 |
| TFT Footprint (μm$^2$) | 3.5 | 13.3 |
| Footprint Reduction Factor | 3.8 | |

Using the parameters listed in Table 2, the calculated footprint area of the conventional TFT is 13.3 μm$^2$, while the calculated footprint area of the saddle channel TFT is 3.5 μm$^2$. Therefore, for this example case, the saddle channel TFT provides a footprint reduction factor of 3.8.

Figure 11:
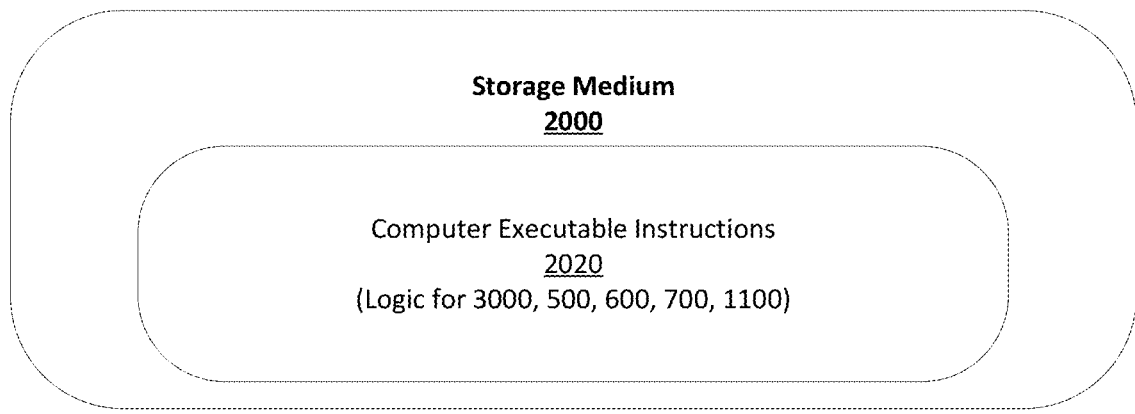
FIG. 11 illustrates a computer-readable storage medium according to an embodiment.

FIG. 11 illustrates an embodiment of a storage medium 2000. The storage medium 2000 may comprise an article of manufacture. In some examples, the storage medium 2000 may include any non-transitory computer readable medium or machine readable medium, such as an optical, magnetic or semiconductor storage. The storage medium 2000 may store various types of computer executable instructions e.g., 2020). For example, the storage medium 2000 may store various types of computer executable instructions to implement techniques 3000, 500, and 600. For example, the storage medium 2000 may store various types of computer executable instructions to implement technique 3000, 500, and 600, which instructions can be executed by a specially programmed computer system operably coupled to manufacturing tools to carry out the micro display manufacturing techniques described herein.

Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 12:
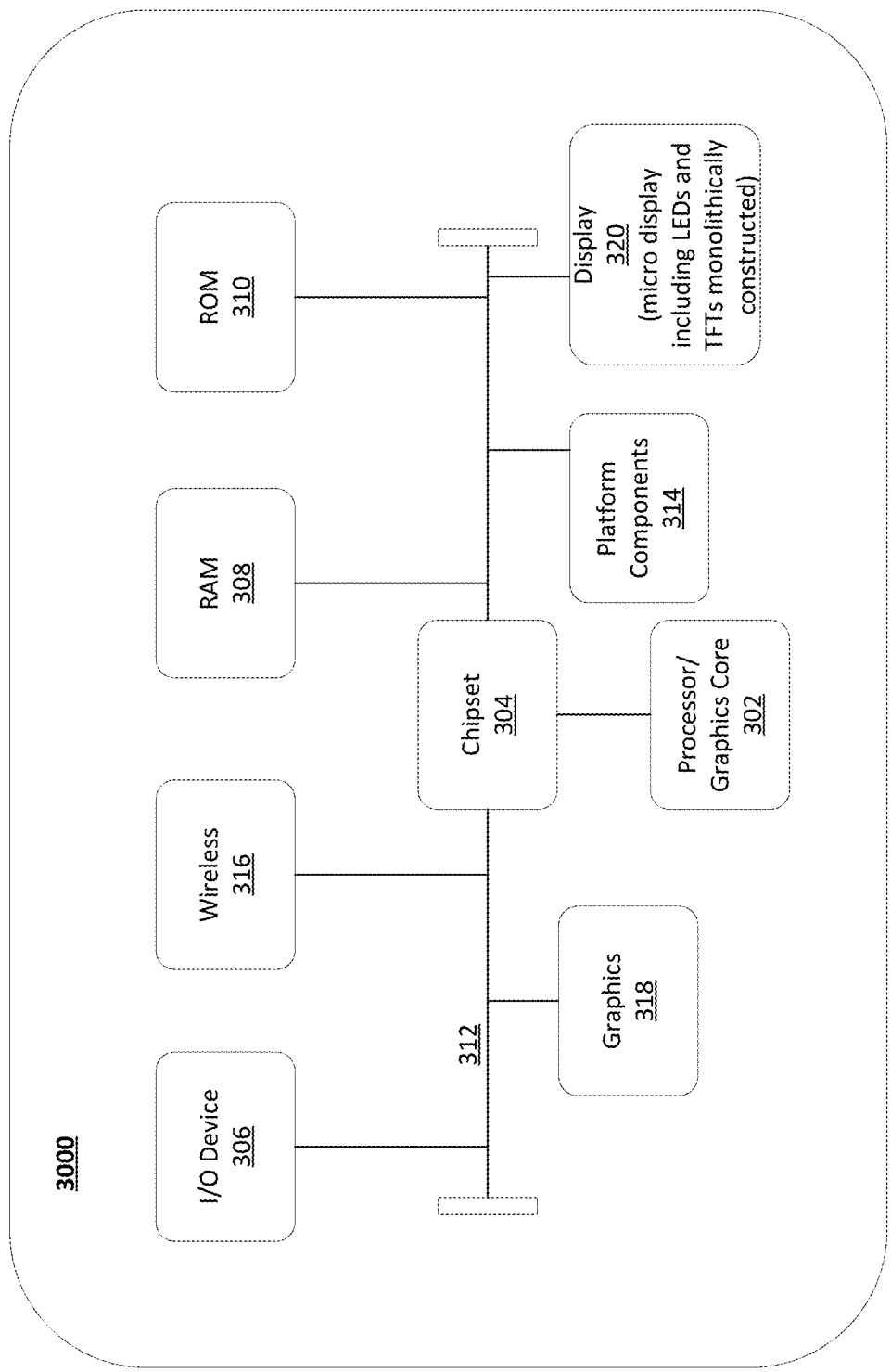
FIG. 12 illustrates a system according to an embodiment.

FIG. 12 is a diagram of an exemplary system embodiment and in particular, depicts a platform 3000, which may include various elements. For instance, this figure depicts that platform (system) 3000 may include a processor/graphics core 302, a chipset 304, an input/output (I/O) device 306, a random access memory (RAM) (such as dynamic RAM (DRAM)) 308, and a read only memory (ROM) 310, display 320 (e.g., a micro display 1000 including micro LEDs 1004-1006 and TFT electronic control circuit 1007; or a micro display 7000 including micro OLEDs 7004-7006 and TFT electronic control circuit 1007), and various other platform components 314 (e.g., a fan, a cross flow blower, a heat sink, DTM system, cooling system, housing, vents, and so forth). System 3000 may also include wireless communications chip 316 and graphics device 318. The embodiments, however, are not limited to these elements.

As depicted, I/O device 306, RAM 308, and ROM 310 are coupled to processor 302 by way of chipset 304. Chipset 304 may be coupled to processor 302 by a bus 312. Accordingly, bus 312 may include multiple lines.

Processor 302 may be a central processing unit comprising one or more processor cores and may include any number of processors having any number of processor cores. The processor 302 may include any type of processing unit, such as, for example, CPU, multi-processing unit, a reduced instruction set computer (RISC), a processor that have a pipeline, a complex instruction set computer (CISC), digital signal processor (DSP), and so forth. In some embodiments, processor 302 may be multiple separate processors located on separate integrated circuit chips. In some embodiments processor 302 may be a processor having integrated graphics, while in other embodiments processor 302 may be a graphics core or cores.

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other. Furthermore, aspects or elements from different embodiments may be combined.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims. The detailed disclosure now turns to providing examples that pertain to further embodiments. The examples provided below are not intended to be limiting.

EXAMPLE 1

An apparatus, comprising: a thin film transistor (TFT) to control at least one of a light emitting diode (LED) or an organic light emitting diode (OLED), the TFT comprising: a gate region; a source region; a drain region; and a channel region configured as a saddle channel extending between the drain region and the source region.

EXAMPLE 2

The apparatus of example 1, the TFT having a top-gate structure, the gate region being positioned vertically higher than the source region, the drain region, and the saddle channel.

EXAMPLE 3

The apparatus of example 1, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

EXAMPLE 4

The apparatus of example 2, the TFT further comprising: a dielectric layer provided between the gate region and the saddle channel.

EXAMPLE 5

The apparatus of example 4, the dielectric layer including at least one of HfZrO, $ZrO_2$, $HfO_2$, $Al_2O_3$, or $TiO_2$.

EXAMPLE 6

The apparatus of example 2, the TFT further comprising: a fin structure below the gate region, the saddle channel being provided on the fin structure, and the contour of the saddle channel being defined by the contour of the fin structure.

EXAMPLE 7

The apparatus of example 6, the fin structure including at least one of $Al_2O_3$, $SiO_2$, or $Si_3N_4$.

EXAMPLE 8

The apparatus of example 6, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

EXAMPLE 9

A system, comprising: at least one of a light emitting diode (LED) or an organic light emitting diode (OLED); and an apparatus, comprising: a thin film transistor (TFT) operatively coupled to the at least one of the LED or the OLED to cause the at least one of the LED or the OLED to selectively turn on or off based on a control signal, the TFT comprising: a gate region; a source region; a drain region; and a channel region configured as a saddle channel extending between the drain region and the source region.

EXAMPLE 10

The system of example 9, the TFT having a top-gate structure, the gate region being positioned vertically higher than the source region, the drain region, and the saddle channel.

EXAMPLE 11

The system of example 9, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

EXAMPLE 12

The system of example 10, the TFT further comprising: a dielectric layer provided between the gate region and the saddle channel.

EXAMPLE 13

The system of example 12, the dielectric layer including at least one of HfZrO, $ZrO_2$, $HfO_2$, $Al_2O_3$, or $TiO_2$.

EXAMPLE 14

The system of example 10, the TFT further comprising: a fin structure below the gate region, the saddle channel being provided on the fin structure, and the contour of the saddle channel being defined by the contour of the fin structure.

EXAMPLE 15

The system of example 14, the fin structure including at least one of $Al_2O_3$, $SiO_2$, or $Si_3N_4$.

EXAMPLE 16

The system of example 14, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

EXAMPLE 17

The system of example 9, the TFT being operatively coupled to the LED, and the TFT being provided above the LED and laterally displaced from the LED.

EXAMPLE 18

The system of example 9, the TFT being operatively coupled to the OLED, and the TFT being provided below the OLED.

EXAMPLE 19

A method comprising: forming at least one fin structure on a dielectric; and forming a channel region, a drain region, and a source region of a thin film transistor (TFT) by deposition of channel material on the at least one fin structure, the channel region being configured as a saddle channel extending between the drain region and the source region of the TFT, and the contour of the saddle channel being defined by the contour of the at least one fin structure.

EXAMPLE 20

The method of example 19, further comprising: forming a gate region of the TFT, the gate region being positioned vertically higher than the source region, the drain region, and the saddle channel.

EXAMPLE 21

The method of example 19, the saddle channel being formed by one of: (i) amorphous silicon; (ii) polycrystalline silicon; (iii) zinc oxide; or (iv) zinc oxide doped with at least one of indium, gallium, aluminum, and titanium.

EXAMPLE 22

The method of example 19, the saddle channel being formed by one of: (i) atomic layer deposition (ALD) of amorphous silicon; (ii) ALD of amorphous silicon followed by annealing to form polycrystalline silicon; or (iii) deposition of indium gallium zinc oxide (IGZO) material by one of ALD, plasma-enhanced atomic layer deposition

EXAMPLE 23

The method of example 20, further comprising: forming a dielectric layer between the gate region and the saddle channel.

EXAMPLE 24

The method of example 20, the TFT being formed one of: (i) above a light emitting diode (LED) and operatively coupled to the LED, the TFT being laterally displaced from the LED; or (ii) below an organic light emitting diode (OLED) and operatively coupled to the OLED.

EXAMPLE 25

The method of example 22, the saddle channel being formed by deposition of indium gallium zinc oxide (IGZO) material by atomic layer deposition (ALD).

EXAMPLE 26

The method of example 23, the dielectric layer including at least one of HfZrO, $ZrO_2$, $HfO_2$, $Al_2O_3$, or $TiO_2$.

EXAMPLE 27

The method of example 20, the at least one fin structure including one of $Al_2O_3$, $SiO_2$, or $Si_3N_4$.

EXAMPLE 28

A system, comprising: a light emitting means; and an apparatus, comprising: a switching means operatively coupled to the light emitting means to cause the light emitting means to selectively turn on or off based on a control signal, the switching means comprising: a gate region; a source region; a drain region; and a channel region configured as a saddle channel extending between the drain region and the source region.

EXAMPLE 29

The system of example 28, the switching means having a top-gate structure, the gate region being positioned vertically higher than the source region, the drain region, and the saddle channel.

EXAMPLE 30

The system of example 28, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

EXAMPLE 31

The system of example 29, the switching means further comprising: a dielectric layer provided between the gate region and the saddle channel.

EXAMPLE 32

The system of example 31, the dielectric layer including at least one of HfZrO, $ZrO_2$, $HfO_2$, $Al_2O_3$, or $TiO_2$.

EXAMPLE 33

The system of example 29, the switching means further comprising: a fin structure below the gate region, the saddle channel being provided on the fin structure, and the contour of the saddle channel being defined by the contour of the fin structure.

EXAMPLE 34

The system of example 33, the fin structure including at least one of $Al_2O_3$, $SiO_2$, or $Si_3N_4$.

EXAMPLE 35

The system of example 33, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

EXAMPLE 36

The system of example 28, the switching means being provided above the light emitting means and laterally displaced from the light emitting means.

EXAMPLE 37

The system of example 28, the switching means being provided below the light emitting means.

EXAMPLE 38

The system of example 33, the saddle channel being an indium gallium zinc oxide (IGZO) channel.

EXAMPLE 39

An apparatus, comprising: a switching means to control a light emitting means, the switching means comprising: a gate region; a source region; a drain region; and a channel region configured as a saddle channel extending between the drain region and the source region.

EXAMPLE 40

The apparatus of example 39, the switching means having a top-gate structure, the gate region being positioned vertically higher than the source region, the drain region, and the saddle channel.

EXAMPLE 41

The apparatus of example 39, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

EXAMPLE 42

The apparatus of example 40, the switching means further comprising: a dielectric layer provided between the gate region and the saddle channel.

EXAMPLE 43

The apparatus of example 42, the dielectric layer including at least one of HfZrO, $ZrO_2$, $HfO_2$, $Al_2O_3$, or $TiO_2$.

EXAMPLE 44

The apparatus of example 40, the switching means further comprising: a fin structure below the gate region, the saddle channel being provided on the fin structure, and the contour of the saddle channel being defined by the contour of the fin structure.

EXAMPLE 45

The apparatus of example 44, the fin structure including at least one of $Al_2O_3$, $SiO_2$, or $Si_3N_4$.

EXAMPLE 46

The apparatus of example 44, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

EXAMPLE 47

A non-transitory, computer-readable medium storing instructions which, when executed on a computing device, cause the computing device to carry out a method according to any one of examples 19-27.

What is claimed is:

1. An apparatus, comprising:
   a thin film transistor (TFT) to control at least one of a light emitting diode (LED) or an organic light emitting diode (OLED), the TFT comprising:
      a gate region;
      a source region;
      a drain region;
      a channel region configured as a saddle channel extending between the drain region and the source region; and
      a dielectric layer provided between the gate region and the saddle channel,
      wherein the TFT has a top-gate structure, the gate region being positioned vertically higher than the source region, the drain region, and the saddle channel.

2. The apparatus of claim 1, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

3. The apparatus of claim 1, the dielectric layer including at least one of HfZrO, $ZrO_2$, $HfO_2$, $Al_2O_3$, or $TiO_2$.

4. The Apparatus of claim 1, the TFT further comprising: a fin structure below the gate region, the saddle channel being provided on the fin structure, and the contour of the saddle channel being defined by the contour of the fin structure.

5. The apparatus of claim 4, the fin structure including at least one of $Al_2O_3$, $SiO_2$, or $Si_3N_4$.

6. The apparatus of claim 4, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

7. A system, comprising:
   at least one of a light emitting diode (LED) or an organic light emitting diode (OLED); and
   an apparatus, comprising:
      a thin film transistor (TFT) operatively coupled to the at least one of the LED or the OLED to cause the at least one of the LED or the OLED to selectively turn on or off based on a control signal, the TFT comprising:
         a gate region;
         a source region;
         a drain region;
         a channel region configured as a saddle channel extending between the drain region and the source region; and
         a dielectric layer provided between the gate region and the saddle channel,
         wherein the TFT has a top-gate structure, the gate region being positioned vertically higher than the source region, the drain region, and the saddle channel.

8. The system of claim 7, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

9. The system of claim 7, the dielectric layer including at least one of HfZrO, $ZrO_2$, $HfO_2$, $Al_2O_3$, or $TiO_2$.

10. The system of claim 7, the TFT further comprising: a fin structure below the gate region, the saddle channel being provided on the fin structure, and the contour of the saddle channel being defined by the contour of the fin structure.

11. The system of claim 10, the fin structure including at least one of $Al_2O_3$, $SiO_2$, or $Si_3N_4$.

12. The system of claim 10, the saddle channel being one of an amorphous silicon channel, a polycrystalline silicon channel, an indium gallium zinc oxide (IGZO) channel, or a doped zinc oxide channel doped with at least one of Ti, Al, Hf, In, Ga, or Ta.

13. The system of claim 7, the TFT being operatively coupled to the LED, and the TFT being provided above the LED and laterally displaced from the LED.

14. The system of claim 7, the TFT being operatively coupled to the OLED, and the TFT being provided below the OLED.

15. The apparatus of claim 1, the TFT comprising a spacer defined on the side of the gate region.

16. The system of claim 7, the TFT comprising a spacer defined on the side of the gate region.

* * * * *